United States Patent [19]

Baker et al.

[11] Patent Number: 5,114,875
[45] Date of Patent: May 19, 1992

[54] PLANAR DIELECTRIC ISOLATED WAFER

[75] Inventors: Thomas R. Baker, Tempe; Bernard W. Boland; David A. Shumate, Phoenix, all of Ariz.

[73] Assignee: Motorola, Inc., Schaumburg, Ill.

[21] Appl. No.: 705,407

[22] Filed: May 24, 1991

[51] Int. Cl.⁵ .................................. H01L 21/76
[52] U.S. Cl. ............................. 437/62; 437/228; 437/233
[58] Field of Search .................. 437/62, 228, 233

[56] References Cited

U.S. PATENT DOCUMENTS

| 3,571,919 | 3/1971 | Gleim et al. | 437/62 |
| 4,870,029 | 9/1989 | Easter et al. | 437/62 |

FOREIGN PATENT DOCUMENTS

| 60-240138 | 11/1985 | Japan | 437/62 |
| 613424 | 1/1986 | Japan | 437/62 |
| 61-71148 | 8/1986 | Japan | 437/62 |
| 61-191042 | 8/1986 | Japan | 437/62 |
| 1-46949 | 2/1989 | Japan | 437/62 |
| 223628 | 1/1990 | Japan | 437/62 |
| 2-125441 | 5/1990 | Japan | 437/67 |

Primary Examiner—Olik Chaudhuri
Assistant Examiner—G. Fourson
Attorney, Agent, or Firm—Joe E. Barbee

[57] ABSTRACT

A substantially planar dielectric wafer is formed by utilizing a polysilicon filler to remove surface irregularities (15, 15'). The polysilicon filler is formed by filling surface irregularities (15, 15') with polysilicon (19) and polishing the polysilicon (19) to form a substantially planar surface. A polishing stop (18) terminates the polishing and prevents damage to the wafer's isolated tubs (13). The polishing stop (18) can also be used as a mask during field oxide growth. The polysilicon filler also protects underlying areas (12) from subsequent etch operations. During subsequent field oxide growth, polysilicon layer (19) is converted to silicon dioxide which enhances dielectric isolation of each tub (13).

18 Claims, 1 Drawing Sheet

PLANAR DIELECTRIC ISOLATED WAFER

BACKGROUND OF THE INVENTION

The present invention relates, in general, to semiconductor devices, and more particularly, to a novel dielectric isolated semiconductor wafer that has a planar surface.

Previously, the semiconductor industry had utilized dielectric isolated wafers to implement dielectric isolated integrated circuits. The previous dielectric isolated wafers typically included a polysilicon substrate that had islands of single crystal silicon which were separated from the polysilicon substrate by a dielectric liner such as silicon dioxide. The dielectric liner isolated the single crystal silicon islands or tubs from the polysilicon substrate. The surface of each single crystal tub was covered with an epitaxial layer of single crystal silicon, and the surface of the polysilicon substrate was covered with an epitaxial layer of polysilicon.

One disadvantage of the previous dielectric isolated wafers was an interface trough that created a discontinuity in the dielectric isolated wafer's surface. The interface trough was a void in the epitaxial layer as it crossed the dielectric liner. Consequently, the interface trough separated the epitaxial layer covering the single crystal silicon tub from the epitaxial layer covering the polysilicon substrate. Because of the interface trough, it was difficult to create metal conductors on the dielectric isolated wafer's surface. Conductor patterns were generally formed by depositing a metal layer on the wafer and etching away unwanted sections of the metal. Metal that landed in the interface trough was difficult to remove and often remained in the trough after etching the metal layer. Metal conductors that crossed the interface trough often were shorted together by the metal residue in the interface trough. It was also difficult to deposit a metal layer that did not have a void as it traversed the interface trough. Consequently, metal conductors that were formed on previous dielectric isolated wafers generally had an open circuit that resulted from insufficient metal coverage of the interface trough, or a short created by metal residues in the interface trough.

In addition to causing opens and shorts in metal interconnect patterns, the dielectric isolation liner was exposed at the interface trough. Consequently, subsequent etching operations, employed during the formation of active and passive device elements in the tubs, etched the exposed dielectric and created a void in the dielectric between the single crystal silicon tub and the polysilicon substrate. This void weakened the mechanical bond between the single crystal silicon tub and the polysilicon substrate. Additionally, the void in the dielectric increased the size of the interface trough and further exacerbated the problems associated with metal interconnects.

Accordingly, it is desirable to have a dielectric isolated wafer that has a planar surface, that does not have an interface trough to cause opens and shorts in metal conductors, and that protects the dielectric liner from subsequent etching operations.

SUMMARY OF THE INVENTION

Briefly stated, the present invention provides a substantially planar dielectric isolated wafer by utilizing a polysilicon filler to remove surface irregularities. The polysilicon filler is formed by filling surface irregularities with polysilicon and polishing the polysilicon to form, a substantially planar surface. In one embodiment, a polishing stop terminates the polishing and prevents damage to the wafer's isolated tubs. The polishing stop can also be used as a mask during field oxide growth. The polysilicon filler also protects underlying areas from subsequent etch operations.

DETAILED DESCRIPTION OF THE DRAWINGS

Figure 1:
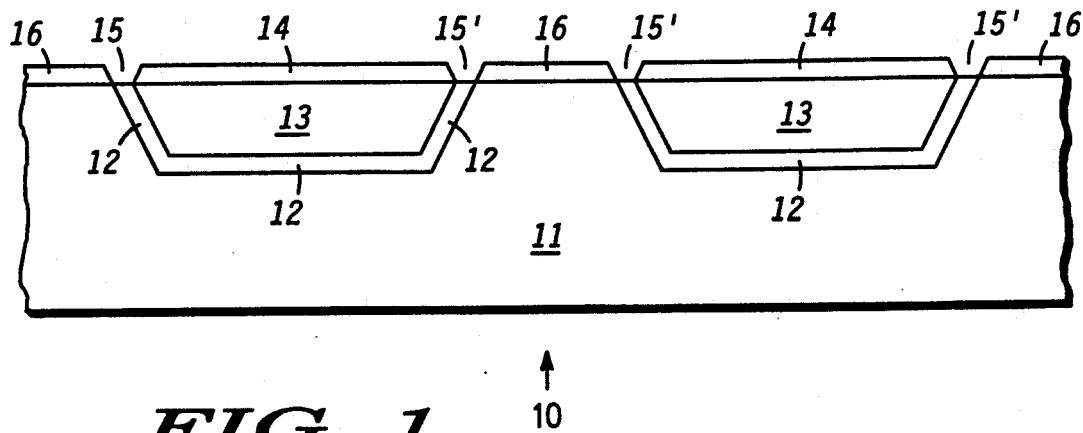
FIG. 1 is an enlarged cross section of a portion of a dielectric isolated wafer.

FIG. 1 illustrates a portion of a dielectric isolated (DI) wafer 10 that includes a polysilicon substrate 11, a plurality of single crystal silicon tubs 13, a dielectric liner 12 that separates each single crystal silicon tub 13 from polysilicon substrate 11, a single crystal epitaxial layer 14 covering each single crystal silicon tub 13, and a polysilicon epitaxial layer 16 covering polysilicon substrate 11. An interface trough 15, and a plurality of interface troughs 15' are created during the growth of epitaxial layers 14 and 16 because the irregularly shaped lattice structure of polysilicon epitaxial layer 16 can not match the smooth crystal structure of single crystal epitaxial layers 14. Consequently, interface trough 15 and interface troughs 15' are formed as the crystal structures of epitaxial layers 14 and 16 grow away from each other. The width and depth of interface troughs 15 and 15' depend on the width of dielectric liner 12 and the thickness of epitaxial layers 14 and 16. In the preferred embodiment, dielectric liner 12 is approximately one micron wide and epitaxial layers 14 and 16 are approximately two to three microns thick. In this embodiment, the resulting interface troughs have a depth of approximately one micron, and a width of approximately four microns which is created as the epitaxial sections grow away from each other. Attempts to deposit metal conductors that cross interface troughs 15 and 15' result in metal forming in the bottom of interface troughs 15 and 15'. Since each interface trough 15 or 15' completely surrounds each tub 13, metal residues in each interface trough 15 or 15' can create shorts between metal conductors as they cross interface troughs 15 and 15'. Also, the metal conductor can have an open due to the inability of the metal to follow the irregular surface of interface troughs 15 and 15'. Additionally, dielectric liner 12 is exposed and can be etched by subsequent process operations.

Figure 2:
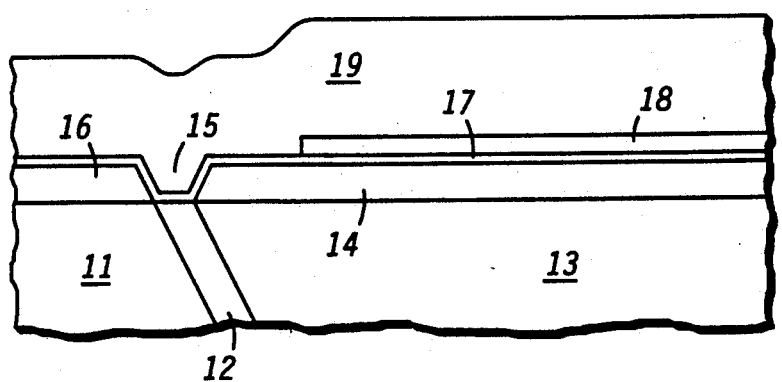
FIG. 2 is an enlarged cross-section of a portion of the dielectric isolated wafer of FIG. 1 with an interface trough that is covered with a layer of polysilicon in accordance with the present invention.

FIG. 2 illustrates an enlarged portion of dielectric isolated (DI) wafer 10 in the vicinity of interface trough 15. Polysilicon substrate 11, single crystal silicon tub 13, dielectric liner 12, single crystal silicon epitaxial layer 14, polysilicon epitaxial layer 16, and interface trough 15 are the same as those shown in FIG. 1. A polishing stop 18 is created by covering the surface of wafer 10 and especially the active area of each single crystal silicon tub 13 with a stress-relief layer 17, then covering the portion of stress-relief layer 17 that is over the active area of tub 13 with polishing stop 18. Prior to forming polishing stop 18, a portion of stress-relief layer 17 can be removed to leave a stress-relief layer that only covers the active area of tub 13. It should be noted that such a removal operation could damage dielectric liner 12. Polishing stop 18 is any suitable material that is not affected by polysilicon polishing operations, such as silicon nitride. Typically, polish stop materials and silicon have different coefficients of thermal expansion which creates stresses between silicon and such polish stop materials, therefore, stress-relief layer 17 is used between polishing stop 18 and epitaxial layer 14. Stress-relief layer 17 is any suitable material that buffers polishing stop 18 from epitaxial layer 14.

In the preferred embodiment, stress-relief layer 17 is a layer of silicon dioxide that is at least 2000 angstrom (Å) thick and is covered by polishing stop 18 that is an approximately 3000 Å thick silicon nitride layer. In this embodiment, the silicon dioxide is a thermally grown oxide that completely covers wafer 10.

After polishing stop 18 has been formed, the surface of wafer 10 is covered with a conformal planarizing layer or thick polysilicon layer 19. Polysilicon layer 19 conforms to the surface onto which it was applied therefore interface trough 15 and the step created by polishing stop 18 are reflected in the surface of polysilicon layer 19. Since polysilicon layer 19 will be polished to remove the irregularities, polysilicon layer 19 should have a thickness that is greater than the height of polishing stop 18 above the surface of dielectric liner 12. In the preferred embodiment, polysilicon layer 19 is at least two microns thick.

Figure 3:
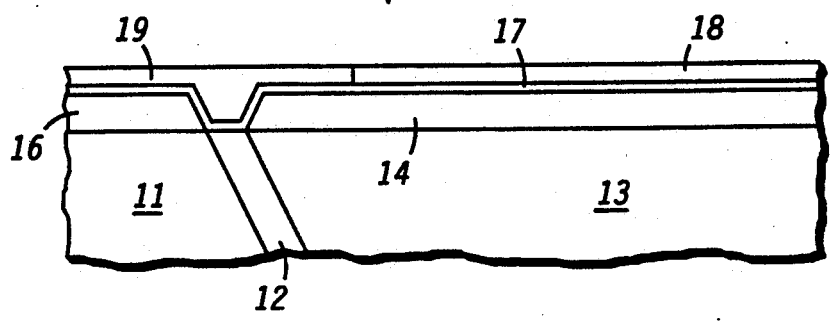
FIG. 3 is an enlarged cross section of a portion of the dielectric isolated wafer after the polysilicon has been planarized in accordance with the present invention.

Referring to FIG. 3, polysilicon layer 19 is polished until polishing stop 18 is exposed. Typically, the polishing is accomplished with a chemical/mechanical polishing technique. After polishing, the surface of polysilicon layer 19 is coplanar to the surface of polishing stop layer 18. The substantially planar dielectric isolated wafer 10 can now be utilized in the subsequent steps of forming active and passive semiconductor devices. Not only does polysilicon layer 19 form a polysilicon filler that substantially planarizes the surface of dielectric isolated wafer 10, it also protects dielectric liner 12 from subsequent etching steps used during the creation of active and passive semiconductor device elements in epitaxial layer 14.

An added benefit is provided by polishing stop 18 which can be utilized as a mask during the growth of field oxide around single crystal silicon tub 13. Typically, field oxide is grown by using high pressure oxidation (HIPOX) that converts exposed silicon to silicon dioxide. Since polishing stop 18 covers the portion of epitaxial layer 14 and single crystal silicon tub 13 that is used for an active area, polishing stop 18 can be used as a mask that protects the active area while growing field oxide around the active area. The field oxide growth also converts polysilicon layer 19 to oxide which provides an additional benefit of effectively extending dielectric liner 12 to the surface of wafer 10 thereby providing a continuous dielectric liner that enhances isolation of each tub 13. Since previous methods of forming dielectric isolated wafers did not have a filler or polysilicon layer 19, field oxide could not grow in the space above dielectric liner 12, thereby increasing the depth of isolation trough 15 (shown in FIG. 2). Consequently, polysilicon layer 19 reduces the number of metal shorts and metal discontinuities on a dielectric isolated wafer. An alternate method of using a thick polysilicon layer to planarize a dielectric wafer does not involve a polishing stop. Instead, the wafer, including the interface trough, is covered with a thin silicon dioxide layer which is then covered by a thick polysilicon layer. Then the polysilicon is polished until it is planar. Although chemical/mechanical polishing techniques can be used, this method typically uses a wet chemical or reactive ion etch to polish the polysilicon. Since a polishing stop is not employed, the polishing is terminated at a predetermined time. This method still requires a mask, such as a silicon nitride layer, in order to protect the active area from the subsequent field oxidation. To form the silicon nitride mask, a thin layer of the thick polysilicon layer is oxidized, then the active area of each tub 13 and epitaxial layer 14 is exposed by removing the portion of the polysilicon and oxidized polysilicon that covers the active area, and a silicon nitride layer is deposited over the active area. The resulting dielectric wafer is substantially planar and is ready to be used in forming dielectric isolated semiconductor devices.

By now it should be appreciated that there has been provided a novel way to improve the integrity of metal conductors on a dielectric isolated wafer. By filling the interface trough of a dielectric isolated wafer with polysilicon and planarizing the polysilicon, the detrimental effects of the interface trough on the dielectric isolated wafer's metallization patterns are minimized. The polishing stop used to terminate planarization of the polysilicon layer provides an additional benefit as a mask for growth of field oxide on the dielectric isolated wafer. Additionally, the filler or polished polysilicon layer protects the dielectric liner from subsequent etching operations.

While the invention has been described with specific preferred embodiments, it is evident that many alternatives and variations will be apparent to those skilled in the semiconductor arts. More specifically the invention has been described for a particular dielectric isolated wafer structure that uses an epitaxial layer, although the method is directly applicable to other dielectric isolated wafer structures, as well as to other semiconductor device structures that require a filler for surface irregularities. It should be noted that the invention is not limited to polysilicon substrates, but may be used with a variety of structures. One such alternate structure is a silicon substrate which has a plurality of tubs that are isolated from the substrate by a dielectric liner.

We claim:

1. A method of planarizing a dielectric isolated wafer which improves continuity of a conductor on the dielectric isolated wafer which comprises:

provyiding a polysilicon substrate having a plurality of single crystal silicon tubs in a surface of the substrate with each tub electrically isolated from the substrate by a dielectric liner, a single crystal epitaxial layer covering each tub, a polysilicon epitaxial layer covering the polysilicon substrate, and an interface trough between the single crystal epitaxial layer and the polysilicon epitaxial layer wherein the interface trough exposes a surface of the dielectric liner;

covering at least a portion of each tub with a stress relief layer;

covering the stress relief layer with a polishing stop;

depositing a layer of polysilicon covering the polishing stop, the interface trough, and at least a portion of the polysilicon epitaxial layer; and planarizing the polysilicon layer by polishing the polysilicon layer until the polishing stop terminates the polishing.

2. The method of claim 1 further including converting at least the polysilicon layer and a portion of the tub not covered by the polishing stop to silicon dioxide by oxidizing the wafer.

3. The method of claim 1 wherein depositing the layer of polysilicon includes depositing the layer of polysilicon having a thickness that is greater than a distance between the exposed surface of the dielectric liner and the polishing stop.

4. The method of claim 1 wherein the covering at least the portion of each tub with the stress relief layer step includes covering the portion of each tub with a silicon dioxide layer.

5. The method of claim 1 wherein covering the stress relief layer with the polishing stop includes covering the stress relief layer with a layer of silicon nitride.

6. The method of claim 1 including providing the dielectric liner with a thickness of approximately one microns.

7. A method of planarizing a dielectric isolated wafer which comprises:
providing a plurality of single crystal silicon tubs in a surface of a polysilicon substrate with each tub electrically isolated from the substrate by a dielectric liner wherein an interface trough that is located in the wafer surface between each single crystal silicon tub and the substrate exposes a surface of the dielectric liner;
covering at least a portion of each tub with a layer of silicon dioxide;
depositing a layer of polysilicon covering at least the silicon dioxide and the exposed surface of the dielectric liner; and
planarizing the polysilicon layer.

8. The method of claim 7 further including removing the polysilicon and the silicon dioxide covering an active area of each tub, and covering the active area with a silicon nitride layer.

9. The method of claim 7 wherein planarizing the polysilicon layer includes planarizing the polysilicon by etching the polysilicon with a reactive ion etch.

10. The method of claim 7 wherein planarizing the polysilicon layer includes etching the polysilicon with a wet chemical etch.

11. The method of claim 7 further including covering the silicon dioxide with a polishing stop prior to depositing the layer of polysilicon.

12. A method of planarizing a dielectric isolated wafer comprising:
providing a plurality of active areas that are formed in a substrate and that are electrically isolated from the substrate by a dielectric wherein an interface through exists between each active area and the substrate;
covering the trough and at least a portion of each active area with a thin stress relief layer;
covering the thin stress relief layer and any exposed portions of the substrate with a planarizing layer; and
removing a portion of an exposed surface of the planarizing layer and leaving a portion of the planarizing layer covering the stress relief layer that is in the trough in order to form a substantially planar surface.

13. A method of planarizing a dielectric isolated wafer comprising:
providing a plurality of active areas that are formed in a substrate with each active area electrically isolated from the substrate by a dielectric wherein an interface trough exists between each active area and the substrate;
covering the trough, and at least a portion of the substrate with a layer of polysilicon; and
removing a portion of an exposed surface of the polysilicon layer and leaving a portion of the polysilicon in the trough in order to form a substantially planar surface.

14. The method of claim 13 further including covering at least a portion of the active area with a polishing stop prior to the covering the trough step.

15. The method of claim 14 wherein covering at least the portion of the active area with the polishing stop includes covering at least the portion of the active area with a layer of silicon dioxide and covering the silicon dioxide with a layer of silicon nitride.

16. The method of claim 14 wherein the removing the portion of the exposed surface of the polysilicon layer step includes using a chemical/mechanical wafer polishing procedure wherein the wafer polishing is terminated by exposing the polishing stop.

17. The method of claim 14 further including forming a field oxide by oxidizing the polysilicon layer and any portion of the active area not covered by the polishing stop.

18. The method of claim 17 wherein oxidizing the polysilicon layer includes performing a high pressure oxidation procedure.

* * * * *

UNITED STATES PATENT AND TRADEMARK OFFICE
CERTIFICATE OF CORRECTION

PATENT NO. : 5,114,875

DATED : May 19, 1992

INVENTOR(S) : Thomas R. Baker et al

It is certified that error appears in the above-identified patent and that said Letters Patent is hereby corrected as shown below:

Claim 12, column 6, line 6, change "through" to --trough--.

Signed and Sealed this

Twenty-first Day of September, 1993

Attest:

BRUCE LEHMAN

Attesting Officer

Commissioner of Patents and Trademarks